(12) United States Patent
Chen (10) Patent No.: US 8,970,404 B2
(45) Date of Patent: Mar. 3, 2015

(54) COMMUNICATION DEVICE AND TEXT CODING AND DECODING METHOD

(71) Applicant: Chi Mei Communication Systems, Inc., New Taipei (TW)

(72) Inventor: Mu-Ann Chen, New Taipei (TW)

(73) Assignee: Chi Mei Communication Systems, Inc., New Taipei (TW)

( * ) Notice: Subject to any disclaimer, the term of this patent is extended or adjusted under 35 U.S.C. 154(b) by 50 days.

(21) Appl. No.: 13/866,028

(22) Filed: Apr. 19, 2013

(65) Prior Publication Data

US 2013/0288724 A1    Oct. 31, 2013

(30) Foreign Application Priority Data

Apr. 26, 2012    (TW) .............................. 101114924 A (51) Int. Cl.
*H03M 7/00*    (2006.01)
*H04W 4/14*    (2009.01)

(52) U.S. Cl.
CPC ..................................... *H04W 4/14* (2013.01)
USPC ............................. 341/50; 709/206; 455/406

(58) Field of Classification Search
CPC ......... H04W 4/14; H03M 7/00; H04L 51/406
USPC ................ 341/50, 107, 63; 709/206; 455/406
See application file for complete search history.

(56) References Cited

U.S. PATENT DOCUMENTS

| 6,522,635 | B1 * | 2/2003 | Bedwell ......................... 370/314 |
| 8,856,322 | B2 * | 10/2014 | Dare et al. ..................... 709/224 |
| 2003/0231207 | A1 * | 12/2003 | Huang ........................... 345/752 |

* cited by examiner

*Primary Examiner* — Peguy Jean Pierre
(74) *Attorney, Agent, or Firm* — Novak Druce Connolly Bove + Quigg LLP (57) ABSTRACT

A communication device includes a text coding and decoding system. The text coding system indexing coded characters of the text data into five-bit first strings according the coding table according to a coding table, line up the five-bit first strings in sequence to form an array, divide the array into eight-bit second strings, and embed a preset indicatory code, a data coding scheme and a length of the array. The text decoding system converts the array into the five-bit first strings according to the data coding scheme, and index the coding table for determining the character of each five-bit first string.

15 Claims, 6 Drawing Sheets

| First string | Character (The first page) | Character (The second page) |
|---|---|---|
| 00000 | 0 | b |
| 00001 | 1 | j |
| 00010 | 2 | k |
| 00011 | 3 | q |
| 00100 | 4 | v |
| 00101 | 5 | x |
| 00110 | 6 | z |
| 00111 | 7 | ! |
| 01000 | 8 | , |
| 01001 | 9 | # |
| 01010 | a | % |
| 01011 | c | & |
| 01100 | d | …… |
| 01100 | e | |
| 01110 | f | |
| …… | …… | |
| 11101 | Space | |
| 11110 | . | |
| 11111 | Next | page |

FIG. 3

(1)
Please answer question ASAP.

(2)
please answer question asap.

(3)
```
   p       l       e       a       s       e     space
[10110] [10010] [01101] [01010] [11000] [01101] [11101]
   a       n       s       w       e       r     space
[01010] [10100] [11000] [11100] [01101] [10111] [11101]
   q       u       e       s       t       i
[11111][00011] [11010] [01101] [11000] [11001] [10001]
   o       n     space     a       s       a
[10101] [10100] [11101] [01010] [11000] [01010]
   p       .
[10110] [11110]
```

COMMUNICATION DEVICE AND TEXT CODING AND DECODING METHOD

BACKGROUND

1. Technical Field

This embodiment is related to a coding and decoding technique, and is particularly related to a communication device comprising a text coding and decoding system and a text coding and decoding method.

2. Description of Related Art

A short message service (SMS) provides a connectionless messaging transmission having a low load and fast speeds. The SMS may include a plurality of formats, for example, a text format and a protocol data unit (PDU) format. The PDU format is common format of SMS and is defined by European telecommunication standards institute (ETSI). In the PDU format, a length of the SMS may be 140 characters according to an eight-bit coding scheme, or may be 160 characters according to a seven-bit coding scheme.

The SMS cannot be afforded more data in a common coding scheme.

Therefore, there is room for improvement within the prior art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present embodiments.

DETAILED DESCRIPTION

In general, the word "module," as used herein, refers to logic embodied in hardware or firmware, or to a collection of software instructions, written in a programming language. In one embodiment, the program language may be Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable media include CDs, DVDs, flash memory, and hard disk drives.

Figure 1:
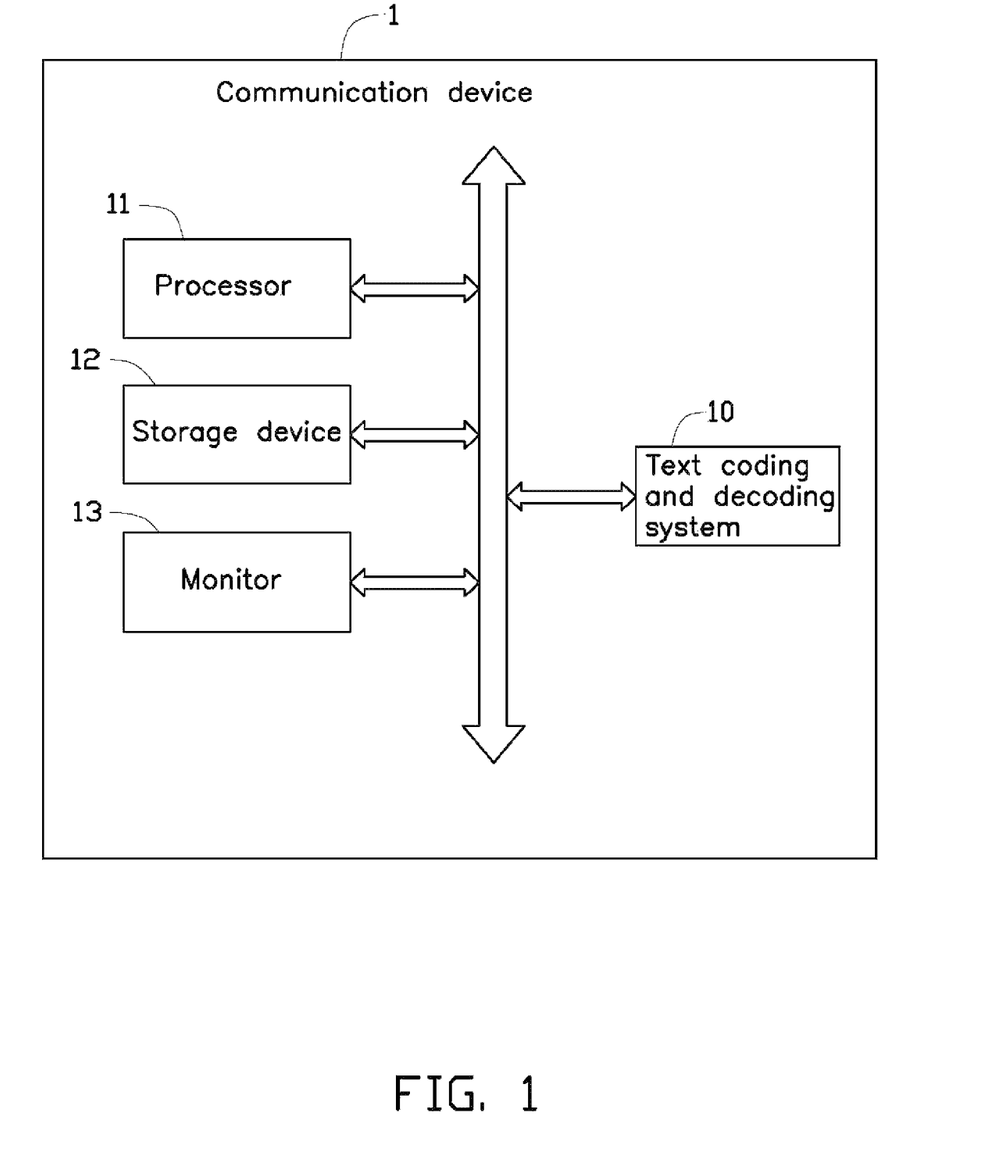
FIG. 1 is a structural diagram of an embodiment of a communication device comprising a text coding and decoding system.

FIG. 1 is a structural diagram of an embodiment of a communication device 1 comprising a text coding and decoding system 10. The text coding and decoding system 10 is used in the communication device 1 for coding and decoding a short message service (SMS) of the communication device 1. In the embodiment, the text coding and decoding system 10 codes and decodes characters and numbers.

The communication device 1 may be a mobile phone, personal digital assistant (PDA), for example. The communication device 1 includes a processor 11, a storage device 12, and a monitor 13.

The processor 11 executes the text coding and decoding system 10 and software installed in the communication device 1, such as an operating system, for example. The storage device 12 may be a memory of the communication device 1 or an external memory card connected to the communication device 1, such as a smart media (SM) card and a secure digital (SD) card, for example. The storage device 12 saves data, such as the SMS, an email, and data received by the text coding and decoding system 10, for example.

The monitor 13 displays data, such as the SMS, a photo, an email, and data of visualization, for example. The monitor 13 may be a liquid crystal display (LCD), such as a LCD touch panel, for example.

Figure 2:
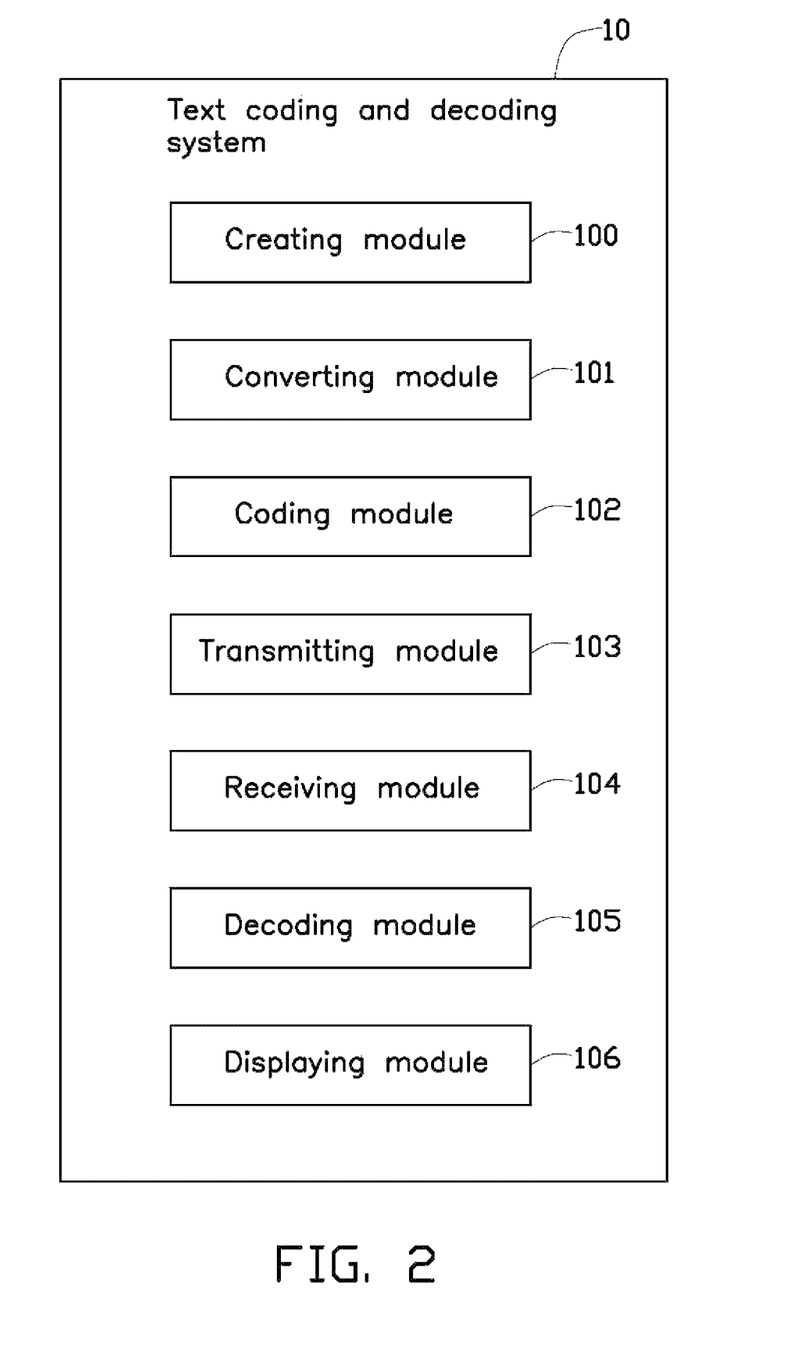
FIG. 2 is a block diagram of an embodiment of a communication device comprising a text coding and decoding system.

FIG. 2 is a block diagram of the embodiment of the communication device 1 comprising the text coding and decoding system 10. In the embodiment, the text coding and decoding system 10 includes a plurality of modules. The modules include a creating module 100, a converting module 101, a coding module 102, a transmitting module 103, a receiving module 104, a decoding module 105, and a displaying module 106. The creating module 100, the converting module 101, the coding module 102, and the transmitting module 103 are implemented for coding text data to create bit strings. The receiving module 104, decoding module 105, and displaying module 106 are implemented for decoding the bit strings to acquire the text data.

Figure 3:
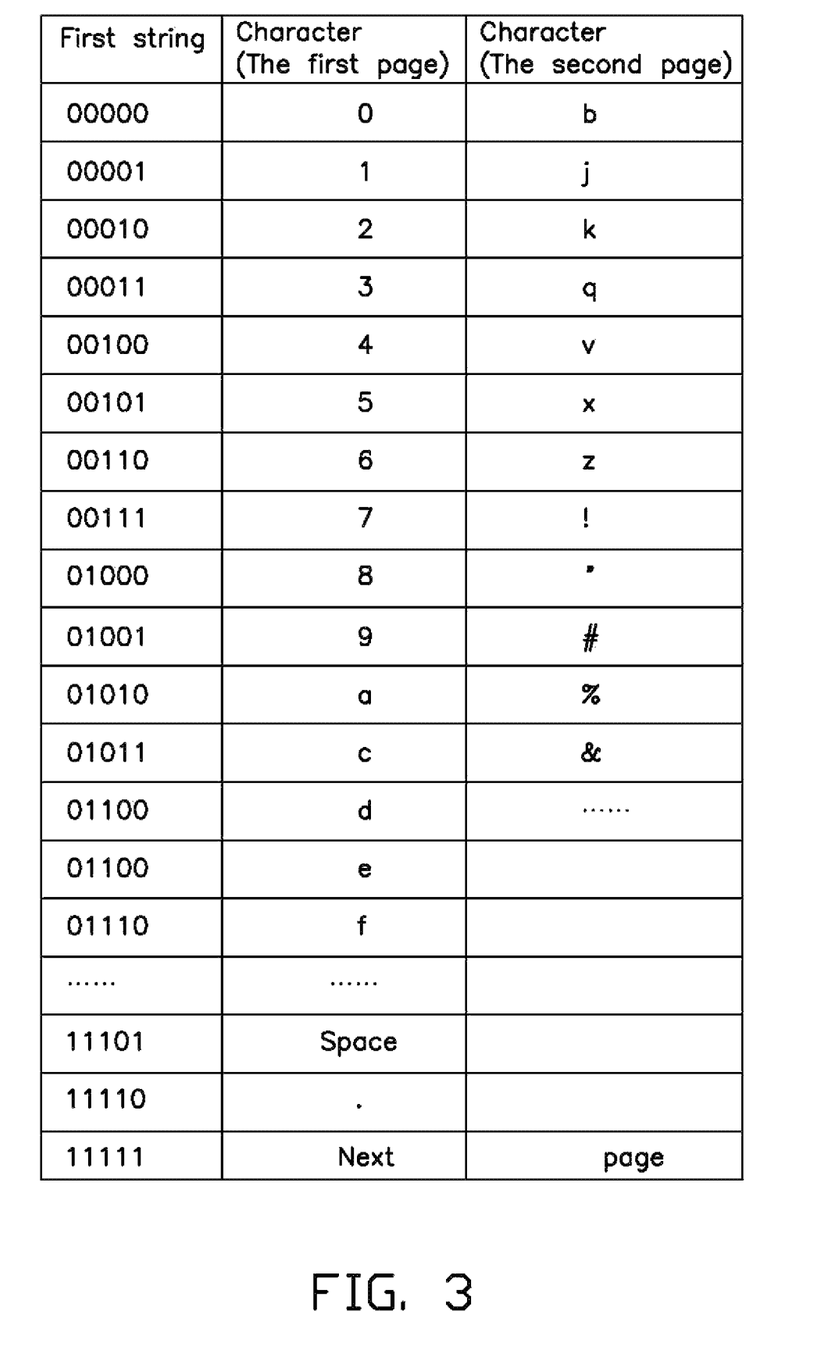
FIG. 3 is a schematic diagram of an embodiment of a coding table saved in a communication device comprising a text coding and decoding system.

The creating module 100 creates a coding table, and saves the coding table into the storage device 12. FIG. 3 is a schematic diagram of the coding table. Each character corresponds to a five-bit first string, for example, a character "a" corresponds to the five-bit first string "01010".

In the embodiment, the creating module 100 sets a frequently used character at a first page of the coding table according to a frequency of the character in commonly use.

The creating module 100 creates a five-bit page string as a page number. For example, the "next page" in the FIG. 3 corresponds to the five-bit page string "11111". In the embodiment, when the character is set at a second page of the coding table, the page string is embedded in a head of the five-bit first string. For example, a string of the character "b" is "1111100000".

In the embodiment, the coding table is only set lower case letters to raise efficiency of coding and to decrease a number of bits of the string. The coding table can be simplified by setting the frequently used character at the first page of the coding table. Most characters are coded in five bits, and characters that are not at the first page of the coding table are coded in ten bits.

The creating module 100 can substitute a character for a preset string when the character cannot be indexed in the coding table. For example, a Chinese character "我," cannot be indexed in the coding table, and the Chinese character "我," may be coded as "11011".

Figure 4:
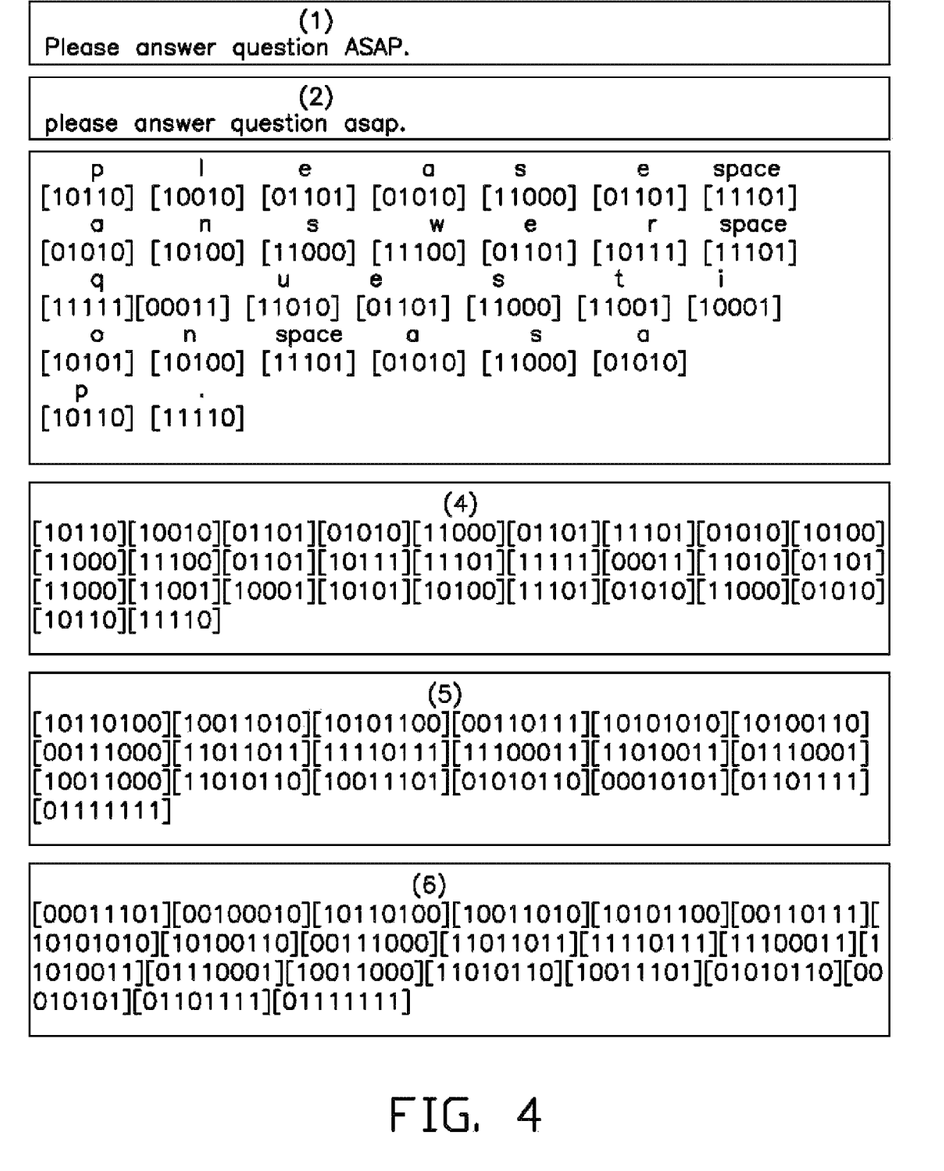
FIG. 4 is a schematic diagram of an embodiment of a coding process of a communication device comprising a text coding and decoding system.

The converting module 101 receives the text data input by an input unit of the communication device 1, and converts each upper case letter of the text data into a lower case letter. FIG. 4 is a schematic diagram of the embodiment of a coding process of the communication device 1 comprising the text coding and decoding system 10. For example, the text data received by the converting module 101 is "Please answer question ASAP" shown in a first sub-graph (1) of the FIG. 4. The converting module 101 converts the upper case letters of the text data into the lower case letters, "please answer question asap", shown in a second sub-graph (2) of the FIG. 4.

The coding module 102 indexes coded characters of the text data into the five-bit first string according to the coding table, shown in a third sub-graph (3) of the FIG. 4. For example, the five-bit first string corresponded to the character "p" is "10110", and a string corresponded to the character "q" is "1111100011", wherein the string "11111" is the page string to express that the character "q" is in the second page of the coding table.

The coding module 102 lines up the five-bit first strings in sequence to form an array, shown in a fourth sub-graph (4) of the FIG. 4, and divides the array into eight-bit second strings, shown in a fifth sub-graph (5) of the FIG. 4. The coding module 102 further supplements a last string with preset bits to form an eight-bit string when the last string is less than eight bits. For example, the preset bit is "1", and the last string of the fifth sub-graph (5) of the FIG. 4 is "01111111", wherein the string, "1111111", is supplemented by the coding module 102.

The coding module 102 embeds a preset indicatory code in a head of the array, and embeds a data coding scheme and a length of the array in a header of the array to code the text data. The data coding scheme is an eight-bit coding scheme, and the length of the array is a number of the characters of the text data. The SMS transmitted via a global system for mobile communications (GSM) is commonly coded in a seven-bit coding scheme. In the embodiment, the SMS is coded in the eight-bit coding scheme. The embodiment divides the array, which is lined up by the five-bit first strings in sequence, into the eight-bit second strings. The eight-bit coding scheme is defined by a user.

In the embodiment, the preset indicatory code is an American standard code for information interchange (ASCII) corresponded to the character of "5B", [00011101][00100010], shown in a sixth sub-graph (6) of the FIG. 4. In other embodiment, the preset indicatory code can be modified according to a requirement for coding and decoding.

The coding module 102 embeds the five-bit page string in a head of the five-bit first string when the character is not indexed in a first page of the coding table. The coding module 102 substitutes a character for a preset string when the character cannot be indexed in the coding table.

In the embodiment, a plurality of communication devices comprising the text coding and decoding system 10 can code and decode the text data. The transmitting module 103 transmits the array to a receiver that communicates with the communication device 1. The receiver may be another communication device 1.

The receiving module 104 receives the array from a sending device that communicates with the communication device 1. The sending device may be another communication device 1.

The decoding module 105 determines whether the array is coded in a preset scheme according to the preset indicatory code of the array. The preset scheme codes the array by the coding table saved in the communication device 1. For example, the decoding module 105 can determine the array is coded by the preset scheme when the preset indicatory code is included in the array.

The decoding module 105 converts the array into the five-bit first strings according to the data coding scheme embedded in the header of the array when the array is coded by the preset scheme. For example, the decoding module 105 converts the array from the eight-bit second strings, shown in the fifth sub-graph (5) of the FIG. 4, to the five-bit first strings, shown in the fourth sub-graph (4) of the FIG. 4.

The decoding module 105 indexes the coding table for determining the character of each five-bit first string. The decoding module 105 may ignore a string when the string cannot be indexed in the coding table. The decoding module 105 further indexes the five-bit first string after the page string when the page string is indexed.

The displaying module 106 displays the text data corresponding to the determined character of each five-bit first string on the monitor 13 of the communication device 1.

Figure 5:
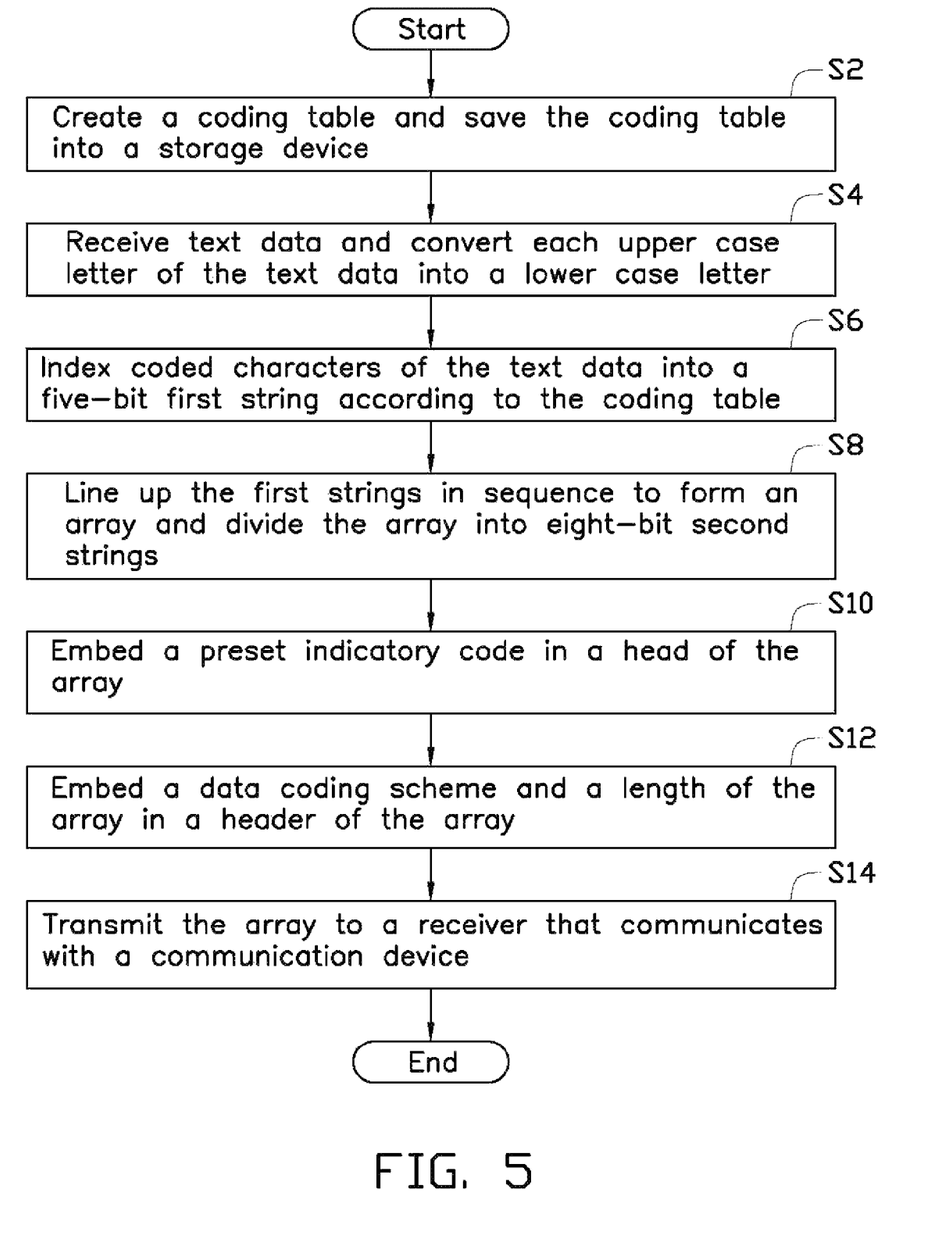
FIG. 5 is a flowchart of an embodiment of a text coding method.

FIG. 5 is a flowchart of an embodiment of a text coding method. In step S2, the creating module 100 creates a coding table and saves the coding table into the storage device 12, and then step S4 is implemented.

In step S4, the converting module 101 receives the text data input by the input unit of the communication device 1, and converts each upper case letter of the text data into a lower case letter, and then step S6 is implemented.

In step S6, the coding module 102 indexes coded characters of the text data into the five-bit first string according to the coding table, and then step S8 is implemented.

In step S8, the coding module 102 lines up the five-bit first strings in sequence to form the array, and divides the array into the eight-bit second strings. The coding module 102 further supplements a last string with the preset bits to form an eight-bit string when the last string of the array is less than eight bits, and then step S10 is implemented.

In step S10, the coding module 102 embeds the preset indicatory code in the head of the array, and then step S12 is implemented.

In step S12, the coding module 102 embeds the data coding scheme and the length of the array in the header of the array to code the text data, and then step S14 is implemented.

In step S14, the transmitting module 103 transmits the array to the receiver that communicates with the communication device 1, and then the flowchart is ended.

Figure 6:
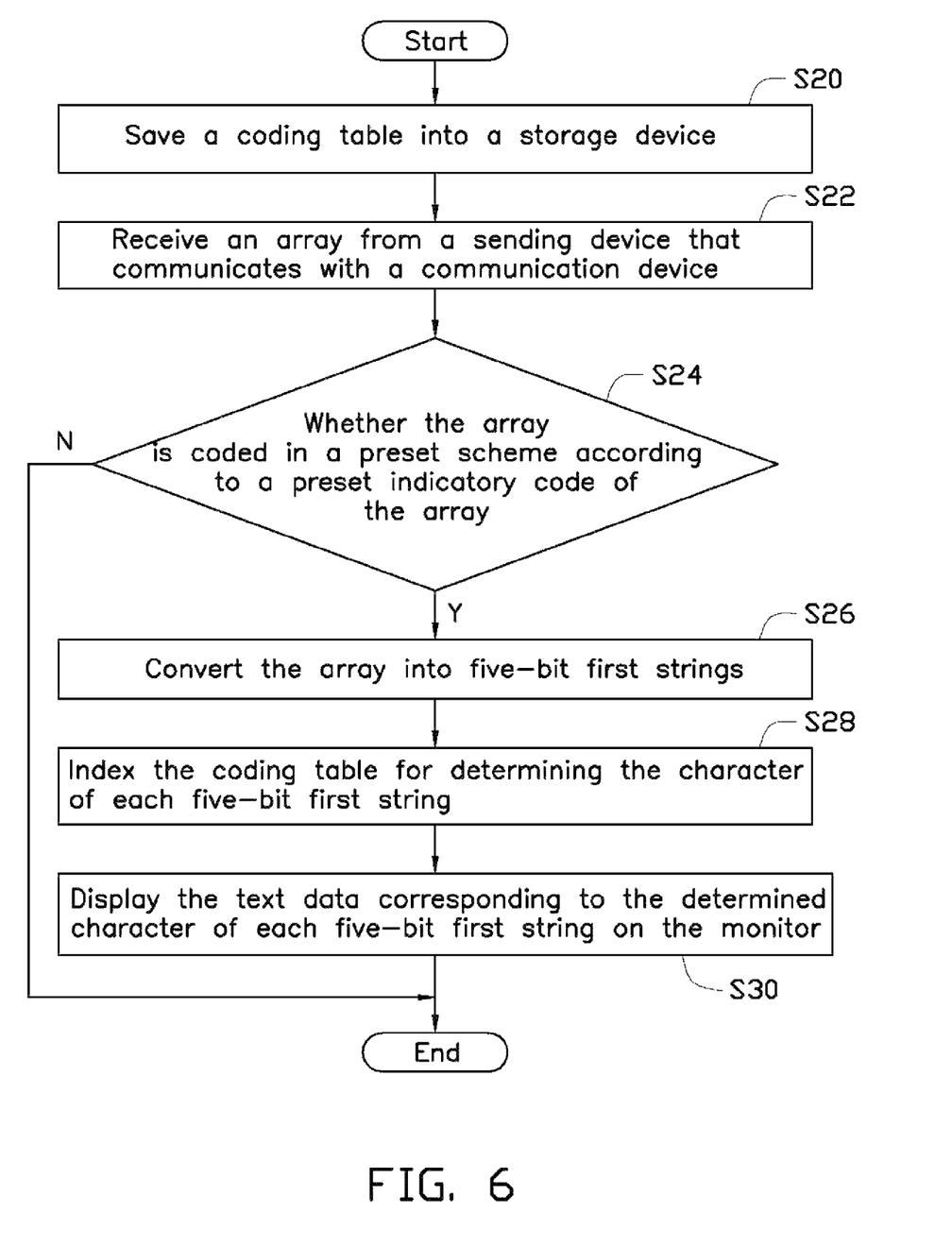
FIG. 6 is a flowchart of an embodiment of a text decoding method.

FIG. 6 is a flowchart of an embodiment of a text decoding method. In step S20, the coding table is saved in the communication device 1, and then step S22 is implemented.

In step S22, the receiving module 104 receives the array from the sending device that communicates with the communication device 1, and then step S24 is implemented.

In step S24, the decoding module 105 determines whether the array is coded in the preset scheme according to the preset indicatory code of the array. When the array is not coded in the preset scheme, the flowchart is ended. The preset scheme is used to code the array by the coding table saved in the communication device 1.

When the array is coded in the preset scheme, the step S26 is implemented. In step S26, the decoding module 105 converts the array into the five-bit first strings according to the data coding scheme embedded in the header of the array, and then step S28 is implemented.

In step S28, the decoding module 105 indexes the coding table for determining the character of each five-bit first string, and then step S30 is implemented.

In step S30, the displaying module 106 displays the text data corresponding to the determined character of each five-bit first string on the monitor 13 of the communication device 1, and then the flowchart is ended.

Depending on the embodiment, certain of the steps described may be removed, others may be added, and the sequence of the steps may be altered. It is also to be understood that the description and the claims drawn to a method may include some indication in reference to certain steps.

However, the indication used is only to be viewed for identifier purposes and not necessarily as a suggestion as to an order for the steps.

The present disclosure is submitted in conformity with patent law. The above disclosure is the preferred embodiment. Any one of ordinary skill in this field can modify and change the embodiment within the spirit of the present disclosure, and all such changes or modifications are deemed included in the scope of the following claims.

What is claimed is:

1. A communication device comprising a text coding and decoding system, comprising:
   a storage device;
   at least one processor; and
   one or more modules stored in the storage device and executed by the at least one processor, the one or more modules comprising:
   a creating module configured to create a coding table stored in the storage device;
   a converting module configured to receive text data, and convert each upper case letter of the text data into a lower case letter;
   a coding module configured to index coded characters of the text data into five-bit first strings according to the coding table, line up the five-bit first strings in sequence to form an array, divide the array into eight-bit second strings, supplement a last string with preset bits to form an eight-bit string when the last string is less than eight bits, embed a preset indicatory code in a head of the array, and embed a data coding scheme and a length of the array in a header of the array to code the text data;
   a transmitting module configured to transmit the array to a receiver that communicates with the communication device;
   a receiving module configured to receive the array from a sending device that communicates with the communication device;
   a decoding module configured to determine whether the array is coded in the data coding scheme according to the preset indicatory code of the array, convert the array into the five-bit first strings according to the data coding scheme embedded in a header of the array when the array is coded by the data coding scheme, and index the coding table for determining the character of each string, wherein the data coding scheme codes the array by the coding table saved in the communication device; and
   a displaying module configured to display a text data corresponding to the determined character of each string on a monitor of the communication device.

2. The communication device of claim 1, wherein the coding table comprises a plurality of pages, wherein the coding module further embeds a page number coded in a five-bit page string in a head of the five-bit first string when the character is not indexed in a first page of the coding table.

3. The communication device of claim 1, wherein the coding module further substitutes a character for a preset string when the character is not indexed in the coding table.

4. The communication device of claim 1, wherein the data coding scheme is an eight-bit coding scheme, wherein the length of the array is a number of the characters of the text data.

5. The communication device of claim 1, wherein the decoding module further indexes the string after a five-bit page string when the page string is indexed, wherein the page string is a page number coded in the five-bit page string.

6. A text coding and decoding method using in a communication device, the text coding and decoding method comprising:
   creating a coding table;
   receiving text data;
   converting each upper case letter of the text data into a lower case letter;
   indexing coded characters of the text data into five-bit first strings according the coding table;
   lining up the five-bit first strings in sequence to form an array;
   dividing the array into eight-bit second strings;
   supplementing a last string with preset bits to form an eight-bit string when the last string is less than eight bits;
   embedding a preset indicatory code in a head of the array;
   embedding a data coding scheme and a length of the array in a header of the array to code the text data;
   transmitting the array to a receiver that communicates with the communication device;
   receiving the array from a sending device that communicates with the communication device, wherein the communication device saves the coding table for indexing each character coded in the five-bit first string;
   determining whether the array is coded in the data coding scheme according to the preset indicatory code of the array, wherein the data coding scheme codes the array by the coding table saved in the communication device;
   converting the array into the five-bit first strings according to the data coding scheme embedded in the header of the array when the array is coded by the data coding scheme;
   indexing the coding table for determining the character of each string; and
   displaying a text data corresponding to the determined character of each string on a monitor of the communication device.

7. The text coding and decoding method of claim 6, the method further comprising:
   embedding a page number coded in a five-bit page string in a head of the five-bit first string when the character is not indexed in a first page of the coding table, wherein the coding table comprises a plurality of pages.

8. The text coding and decoding method of claim 6, the method further comprising:
   substituting a character for a preset string when the character is not indexed in the coding table.

9. The text coding method of claim 6, wherein the data coding scheme is an eight-bit coding scheme, and the length of the array is a number of the characters of the text data.

10. The text coding and decoding method of claim 6, the method further comprising:
    indexing a string after a five-bit page string when the five-bit page string is indexed, wherein the five-bit page string is a page number coded in the five-bit page string.

11. A non-transitory computer-readable storage medium having stored thereon instructions that, when executed by at least one processor of a communication device, cause the communication device to perform a text coding and decoding method, the text coding and decoding method comprising:
    creating a coding table for indexing each character coded in a five-bit first string;
    receiving text data, and convert each upper case letter of the text data into a lower case letter;
    determining the five-bit first string of each character of the text data according the coding table;
    lining up the determined five-bit first strings in sequence to form an array;
    dividing the array into eight-bit second strings;

supplementing a last string with preset bits to form an eight-bit string when the last string is less than eight bits;

embedding a preset indicatory code in a head of the array;

embedding a data coding scheme and a length of the array in a header of the array to code the text data;

transmitting the array to a receiver that communicates with the communication device;

receiving the array from a sending device that communicates with the communication device, wherein the communication device saves the coding table for indexing each character coded in the five-bit first string;

determining whether the array is coded in the data coding scheme according to the preset indicatory code of the array, wherein the data coding scheme codes the array by the coding table saved in the communication device;

converting the array into the five-bit first strings according to the data coding scheme embedded in the header of the array when the array is coded by the data coding scheme;

indexing the coding table for determining the character of each string; and displaying a text data corresponding to the determined character of each string on a monitor of the communication device.

12. The storage medium of claim 11, wherein the text coding and decoding method further comprises:

embedding a page number coded in a five-bit page string in a head of the five-bit first string when the character is not indexed in a first page of the coding table, wherein the coding table comprises a plurality of pages.

13. The storage medium of claim 11, wherein the text coding and decoding method text coding further comprises:

substituting a character for a preset string when the character is not indexed in the coding table.

14. The storage medium of claim 11, wherein the data coding and decoding scheme is an eight-bit coding scheme, and the length of the array is a number of the characters of the text data.

15. The storage medium of claim 11, wherein the text coding and decoding method further comprises:

indexing a string after a five-bit page string when the five-bit page string is indexed, wherein the five-bit page string is a page number coded in the five-bit page string.

* * * * *